United States Patent
Zong et al.

(10) Patent No.: US 10,726,776 B2
(45) Date of Patent: Jul. 28, 2020

(54) PIXEL-BY-PIXEL CALIBRATION METHOD

(71) Applicant: Xi'an NovaStar Tech Co., Ltd., Xi'an (CN)

(72) Inventors: Jingguo Zong, Xi'an (CN); Xingmei Zhao, Xi'an (CN); Cheng Yang, Xi'an (CN)

(73) Assignee: XI'AN NOVASTAR TECH CO., LTD., Xi'an (CN)

(*) Notice: Subject to any disclaimer, the term of this patent is extended or adjusted under 35 U.S.C. 154(b) by 0 days.

(21) Appl. No.: 16/388,893

(22) Filed: Apr. 19, 2019

(65) Prior Publication Data

US 2019/0244561 A1 Aug. 8, 2019

Related U.S. Application Data

(63) Continuation of application No. PCT/CN2017/086224, filed on May 26, 2017.

(30) Foreign Application Priority Data

Nov. 17, 2016 (CN) .......................... 2016 1 1013396

(51) Int. Cl.
*G06F 3/14* (2006.01)
*G06F 3/147* (2006.01)
(Continued)

(52) U.S. Cl.
CPC .......... *G09G 3/32* (2013.01); *G09F 13/0413* (2013.01); *H01L 27/3211* (2013.01);
(Continued)

(58) Field of Classification Search
CPC . G02F 1/13336; G09F 13/0413; G09G 3/006; G09G 3/1423; G09G 3/1446;
(Continued)

(56) References Cited

U.S. PATENT DOCUMENTS 5,734,369 A * 3/1998 Priem ...................... G09G 5/02
345/597
5,805,117 A * 9/1998 Mazurek ............. G02F 1/13336
345/1.3
(Continued)

FOREIGN PATENT DOCUMENTS

| KR | 20140126606 A | * | 10/2014 | |
|---|---|---|---|---|
| WO | WO-2017190797 A1 | * | 11/2017 | ........... G06F 3/1446 |
| WO | WO-2018206088 A1 | * | 11/2018 | ............. H04N 17/04 |

*Primary Examiner* — Michael J Eurice
(74) *Attorney, Agent, or Firm* — Hemisphere Law, PLLC; Zhigang Ma

(57) ABSTRACT

A pixel-by-pixel calibration method is provided. Multiple sample cabinets are selected from to-be-calibrated cabinets to form a small screen with the sample cabinets, image acquisitions are performed on the small screen and luminance-chrominance mean deviation ratios are calculated. The sample cabinets are placed at fulcrum positions of a large screen to be calibrated, and the other remaining cabinets are placed at other positions. Full-screen original luminance-chrominance values are obtained by image acquisition on the large screen, original luminance-chrominance values of the sample cabinets are adjusted by the luminance-chrominance mean deviation ratios, and luminance-chrominance distribution fitting surfaces are generated by adjusted full-screen original luminance-chrominance values to amend the full-screen original luminance-chrominance values. Amended full-screen luminance-chrominance values are used as luminance-chrominance initial values and luminance-chrominance target values are set, and full-screen pixel-by-pixel calibration coefficients of the large screen are obtained. The effect of arbitrarily splicing LED cabinets after calibration can be achieved.

11 Claims, 2 Drawing Sheets

| Sample cabinet No.1 | | | | | | | Sample cabinet No.2 |
|---|---|---|---|---|---|---|---|
| | | | | | | | |
| | | | | | | | |
| | | | | Sample cabinet No.5 | Sample cabinet No.6 | | |
| | | | | | | | |
| Sample cabinet No.3 | | | | | | | Sample cabinet No.4 |

(51) Int. Cl.
*G09G 3/32* (2016.01)
*H01L 27/32* (2006.01)
*G09F 13/04* (2006.01)
*H04N 1/60* (2006.01)
*G02F 1/1333* (2006.01)

(52) U.S. Cl.
CPC . *G02F 1/13336* (2013.01); *G09G 2320/0693* (2013.01); *H04N 1/6052* (2013.01)

(58) Field of Classification Search
CPC .... G09G 3/147; G09G 3/32; G09G 2300/026; G09G 2320/0693; H04N 1/6052; H04N 27/3211

See application file for complete search history.

(56) References Cited

U.S. PATENT DOCUMENTS

| | | | | |
|---|---|---|---|---|
| 6,456,339 | B1* | 9/2002 | Surati | G03B 37/04 348/744 |
| 9,059,337 | B1* | 6/2015 | Robinson | H05B 47/105 |
| 9,477,438 | B1* | 10/2016 | Hochman | G09G 5/006 |
| 9,626,145 | B1* | 4/2017 | Fu | G09G 3/20 |
| 2002/0027608 | A1* | 3/2002 | Johnson | H04N 9/12 348/383 |
| 2003/0098819 | A1* | 5/2003 | Sukthankar | G09G 3/002 345/1.1 |
| 2003/0227470 | A1* | 12/2003 | Genc | G06F 3/011 345/633 |
| 2003/0234343 | A1* | 12/2003 | Cok | G09F 9/3026 250/208.1 |
| 2004/0008155 | A1* | 1/2004 | Cok | G06F 3/1446 345/1.3 |
| 2004/0032534 | A1* | 2/2004 | Fujino | H04N 9/12 348/655 |
| 2004/0085477 | A1* | 5/2004 | Majumder | H04N 9/12 348/383 |
| 2005/0017922 | A1* | 1/2005 | Devos | G09G 3/3216 345/6 |
| 2005/0021258 | A1* | 1/2005 | Fasciano | H04N 17/02 702/67 |
| 2005/0134525 | A1* | 6/2005 | Tanghe | G06F 3/1446 345/1.1 |
| 2005/0134526 | A1* | 6/2005 | Willem | G06F 3/1446 345/1.3 |
| 2005/0134599 | A1* | 6/2005 | Nayar | G06T 3/00 345/589 |
| 2005/0174309 | A1* | 8/2005 | Bouwens | G09G 3/22 345/83 |
| 2006/0007240 | A1* | 1/2006 | Herbert | G06F 3/1446 345/601 |
| 2006/0110052 | A1* | 5/2006 | Finlayson | G06T 5/008 382/232 |
| 2007/0242240 | A1* | 10/2007 | Webb | G03B 21/00 353/121 |
| 2008/0018570 | A1* | 1/2008 | Gerets | G09G 3/3208 345/84 |
| 2009/0073080 | A1* | 3/2009 | Meersman | G02F 1/13336 345/1.3 |
| 2010/0019997 | A1* | 1/2010 | Chui | G09G 3/18 345/83 |
| 2010/0020107 | A1* | 1/2010 | Chui | G09G 3/005 345/690 |
| 2010/0238090 | A1* | 9/2010 | Pomerantz | G02F 1/13336 345/1.3 |
| 2011/0216205 | A1* | 9/2011 | Flatt | H04N 9/3147 348/189 |
| 2011/0298763 | A1* | 12/2011 | Mahajan | G09G 3/025 345/207 |
| 2014/0152706 | A1* | 6/2014 | Park | G09G 3/2003 345/690 |
| 2014/0313423 | A1* | 10/2014 | Johnson | G03B 21/13 348/745 |
| 2014/0333593 | A1* | 11/2014 | Nagashima | G09G 3/3426 345/207 |
| 2015/0243251 | A1* | 8/2015 | Ohnishi | G06F 3/1446 345/690 |
| 2015/0279037 | A1* | 10/2015 | Griffin | G06F 3/1446 345/1.3 |
| 2015/0356948 | A1* | 12/2015 | Lin | G09G 5/10 345/690 |
| 2015/0371405 | A1* | 12/2015 | Zhao | G09G 3/32 345/589 |
| 2016/0086582 | A1* | 3/2016 | Hu | G06F 3/147 345/1.3 |
| 2016/0155389 | A1* | 6/2016 | Beon | G09G 3/3406 345/690 |
| 2017/0270896 | A1* | 9/2017 | Cope | G09G 5/10 |
| 2019/0191153 | A1* | 6/2019 | Speigle | G09G 5/02 |
| 2019/0369497 | A1* | 12/2019 | Mori | G03F 7/0007 |

* cited by examiner

|Sample cabinet No.1|Sample cabinet No.2|Sample cabinet No.3|
|---|---|---|
|Sample cabinet No.4|Sample cabinet No.5|Sample cabinet No.6|

FIG. 1

| Sample cabinet No.1 | | | | | | | Sample cabinet No.2 |
|---|---|---|---|---|---|---|---|
| | | | | | | | |
| | | | Sample cabinet No.5 | Sample cabinet No.6 | | | |
| | | | | | | | |
| Sample cabinet No.3 | | | | | | | Sample cabinet No.4 |

FIG. 2

PIXEL-BY-PIXEL CALIBRATION METHOD

CROSS REFERENCE TO RELATED APPLICATION

The disclosure claims the priority of the Chinese Patent Application No. 201611013396.9, entitled "Pixel-by-pixel Calibration Method", filed on Nov. 17, 2016, and the content of which is incorporated herein by reference in its entirety.

FIELD OF THE DISCLOSURE

The disclosure relates to the field of LED display and calibration technology, and more particularly to a pixel-by-pixel calibration method.

BACKGROUND

In recent years, the LED display screen rental industry has developed faster and faster, and characteristics of rental display screens are as follows: 1) different used time lengths of a same batch of cabinets would bring different degrees of cabinet-level luminance-chrominance differences; 2) an additional order required to a same batch of cabinets would bring luminance-chrominance differences between new and old cabinets; and 3) replacement of light board (also referred to as display unit board) in a same batch of cabinets would bring a light board-level luminance-chrominance difference in the cabinet. For the rental display screens with the above characteristics, if the rental display screen built/assembled in a factory and processed by an existing calibration method is dissembled and then cabinets thereof are arbitrarily spliced together in a rental site, the luminance-chrominance in each cabinet is approximately uniform/even but there is a problem of inconsistent surface transition among the cabinets. At present, there are three main methods for pixel-by-pixel calibrations of rental display screens in the industry as follows that: a first method is to record cabinet calibration numbers and assemble a display screen at each rental site in strict accordance with the order of the calibration numbers, but this method is time-consuming and laborious and further cannot be universal; a second method is to carry out a full-screen calibration after a LED screen is assembled at each rental site, this method can ensure luminance-chrominance uniformity of the display screen at the rental site, but the frequent calibration is too troublesome and thus renters/lessors are unacceptable; and a third method is to use high-precision luminance-chrominance measuring instruments such as Minolta CS100A, CS2000, etc., and in particular a luminance-chrominance meter is employed in the factory to standardize in a manner of cabinet-by-cabinet to thereby calibrate each rental cabinet, this method is currently the mainstream, but expensive luminance-chrominance measuring instruments are also difficult to be accepted by the renters. Therefore, the rental screens put forward higher requirements for the pixel-by-pixel calibration technology of LED display screens.

SUMMARY

Therefore, in view of the drawbacks and shortcomings in the related art, the disclosure provides a pixel-by-pixel calibration method.

Specifically, a pixel-by-pixel calibration method according to an embodiment of the disclosure includes steps of: (i) obtaining luminance-chrominance values of a small screen with sample cabinets by image acquisition on the small screen, wherein the small screen is formed by splicing at least three LED cabinets which are selected from a plurality of LED cabinets to be calibrated as the sample cabinets; (ii) obtaining luminance-chrominance mean deviation ratios among the sample cabinets according to the luminance-chrominance values of the small screen; (iii) obtaining original luminance-chrominance values of a large screen to be calibrated by image acquisition on the large screen, wherein the large screen is formed by splicing the sample cabinets and some or all of LED cabinets of the plurality of LED cabinets to be calibrated except the sample cabinets; (iv) obtaining adjusted luminance-chrominance values of the large screen by adjusting original luminance-chrominance values of the sample cabinets in the original luminance-chrominance values of the large screen by use of the luminance-chrominance mean deviation ratios among the sample cabinets; (v) generating luminance-chrominance distribution fitting surfaces of the large screen according to the adjusted luminance-chrominance values of the large screen, and amending the original luminance-chrominance values of the large screen according to the luminance-chrominance distribution fitting surfaces to thereby obtain fitting surface amended luminance-chrominance values of the large screen; and (vi) setting luminance-chrominance target values based on means of the original luminance-chrominance values of the sample cabinets in the large screen and setting the fitting surface amended luminance-chrominance values of the large screen as luminance-chrominance initial values, and thereby obtaining full-screen pixel-by-pixel calibration coefficients of the large screen.

According to an embodiment of the disclosure, after the step (vi), the pixel-by-pixel calibration method further includes: dividing the full-screen pixel-by-pixel calibration coefficients of the large screen into a plurality of cabinet calibration coefficient files, and storing the plurality of cabinet calibration coefficient files respectively to receiving cards equipped by corresponding cabinets to be calibrated.

According to an embodiment of the disclosure, the large screen is formed by splicing the sample cabinets and some rather than all of the LED cabinets of the plurality of LED cabinets to be calibrated except the sample cabinets, the pixel-by-pixel calibration method further includes: keeping the sample cabinets unchanged and replacing the LED cabinets in other positions of the large screen different from positions of the sample cabinets by some or all of remaining of the plurality of LED cabinets to be calibrated, to thereby obtain a new large screen to be calibrated; obtaining original luminance-chrominance values of the new large screen by image acquisition on the new large screen; and obtaining full-screen pixel-by-pixel calibration coefficients of the new large screen by performing the step (iv), the step (v) and the step (vi) again.

According to an embodiment of the disclosure, the step (v) includes: performing polynomial surface fittings based on least squares method on the adjusted luminance-chrominance values of the large screen and giving weighted coefficients of greater than 1 to adjusted luminance-chrominance values of the sample cabinets in the adjusted luminance-chrominance values of the large screen, to thereby obtain the luminance-chrominance distribution fitting surfaces of the large screen.

According to an embodiment of the disclosure, the step (vi) includes: using each luminance mean in the means of the original luminance-chrominance values of the sample cabinets in the large screen after being sacrificed with a certain percentage as a luminance target value in the luminance-chrominance target values, and setting each chrominance target value in the luminance-chrominance target values to be a default value.

According to an embodiment of the disclosure, the plurality of LED cabinets are RGB full-color LED cabinets.

One of the above technical solutions may have the following advantages or benefits: (a) avoiding the problem of inconsistent surface transition caused by arbitrary splicing of cabinets after being calibrated; (b) avoiding the trouble of recording and finding cabinet calibration numbers in rental sites; (c) avoiding the trouble of requiring full-screen calibration at each rental site; and (d) allowing the renter/lessor to save the costs of purchasing luminance-chrominance measuring instruments.

BRIEF DESCRIPTION OF THE DRAWINGS

In order to more clearly illustrate technical solutions of embodiments of the disclosure, drawings used in the embodiments will be briefly introduced below. Apparently, the drawings in the description below are merely some embodiments of the disclosure, a person skilled in the art can obtain other drawings according to these drawings without creative efforts.

FIG. 1 is a schematic view of a small screen with sample cabinets according to an embodiment of the disclosure.

FIG. 2 is a schematic view of a large screen to be calibrated according to an embodiment of the disclosure.

DETAILED DESCRIPTION OF EMBODIMENTS

Figure 3:
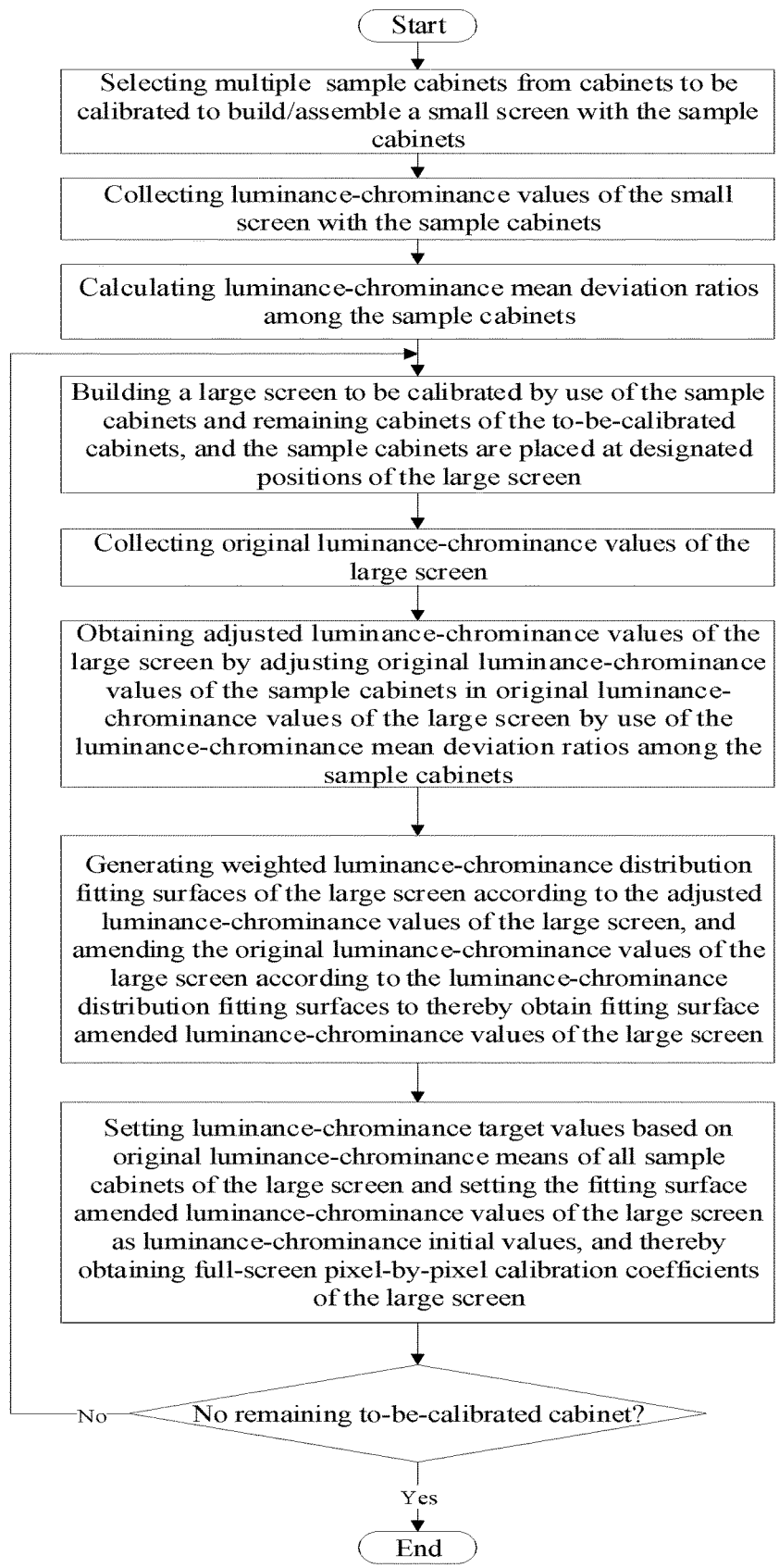
FIG. 3 is a flowchart of a pixel-by-pixel calibration method capable of realizing arbitrary splicing of LED cabinets according to an embodiment of the disclosure.

Technical solutions of embodiments of the disclosure will be clearly and fully described in the following with reference to the accompanying drawings in the embodiments of the disclosure. Apparently, the described embodiments are some of the embodiments of the disclosure, but not all of the embodiments of the disclosure. All other embodiments obtained by skilled person in the art without creative efforts based on the described embodiments of the disclosure are within the scope of protection of the instant application.

In view of the calibration problems of current rental display screens, the following embodiments of the disclosure provide a pixel-by-pixel calibration method capable of realizing arbitrary splicing of LED cabinets. The pixel-by-pixel calibration method includes: firstly selecting multiple (i.e., more than one) sample cabinets from cabinets to be calibrated to build/assemble a small screen (also referred to as reference screen) with the sample cabinets, performing images acquisition on the small screen with the sample cabinets and calculating luminance-chrominance mean deviation ratios among the sample cabinets; secondly placing the sample cabinets at fulcrum positions (also referred to as reference positions) of a large screen to be calibrated (also referred to as to-be-calibrated screen) and placing other remaining cabinets to be calibrated at any other positions of the large screen different from the fulcrum positions; afterwards performing images acquisition on the large screen to be calibrated and increasing weights of luminance-chrominances the sample cabinets at the fulcrum positions during a calibration process to perform fitting surface amendments; and finally setting calibration target values based on luminance-chrominance means of all the sample cabinets located at the fulcrum positions to calculate pixel-by-pixel calibration coefficients of all the cabinets in the entire large screen.

The pixel-by-pixel calibration method can solve the problem of arbitrary splicing of the LED cabinets for the rental display screens, and not only can allow arbitrary splicing of the LED cabinets in the display screen built at the rental site, but also can ensure consistent luminance-chrominance among the LED cabinets in the display screen built at the rental site.

Specifically, in an illustrated embodiment, RGB full-color LED cabinets are taken as an example, and the pixel-by-pixel calibration method capable of realizing arbitrary splicing of LED cabinets is implemented as follows.

(1) Selecting multiple cabinets from cabinets to be calibrated (also referred to as to-be-calibrated cabinets) as sample cabinets to build/assemble a small screen with the sample cabinets.

First, selection requirements of the sample cabinets are that: the number/amount of LED cabinets selected from the to-be-calibrated cabinets as the sample cabinets is not less than 3, there is no obvious/significant luminance-chrominance difference in each of the sample cabinets, and a certain luminance-chrominance difference among the sample cabinets is allowed;

Second, building requirements of the small screen with the sample cabinets are that: six sample cabinets shown in FIG. 1 are taken as an example and are typically built by splicing in a row and column arrangement, for example, it is preferable to be an arrangement form of 2*3 (two rows and three columns) or 3*2, and as far as possible to avoid an acquisition gradient of an image acquisition equipment such as an area array camera on left-right or up-down direction of the small screen with the sample cabinets caused by an arrangement form of 1*6 or 6*1.

(2) Erecting an image acquisition equipment such as an area array camera for image acquisition and calculating luminance-chrominance mean deviation ratios among the sample cabinets.

First, making a distance between the area array camera and the small screen as far as possible and acquiring/collecting red, green and blue monochrome images with a relatively small focal length value. Herein, the small focal length value means that an image of the small screen with the sample cabinets is smaller than the camera window, which can reduce an acquisition gradient of the camera. During the image acquisition, the small screen with the sample cabinets may be controlled to display monochrome pictures such as a red picture, a green picture and a blue picture in a preset display order so as to acquire red, green and blue monochrome images. Of course, the display order of the monochrome pictures is not limited to this;

Second, extracting red (R), green (G) and blue (B) luminance-chrominance values of the small screen with the sample cabinets.

In particular, the extracting of the red, green and blue luminance-chrominance values from the red, green and blue monochrome images is an existing mature technology, and specific steps thereof may be as follows that: firstly performing points positioning on each monochrome image, secondly counting luminance component values and chrominance component values of LED pixels of each monochrome image in a pixel-by-pixel manner, then normalizing luminance-chrominance values of each monochrome image (keeping a ratio of RGB components unchanged), and finally combining the luminance-chrominance values (including the luminance component values and the chrominance component values) of the monochrome images. It is noted that, if the red, green and blue luminance-chrominance values have acquisition gradients associated with the camera, it is preferred that surface fittings are performed to correct the gradients;

Third, calculating luminance-chrominance mean deviation ratios among the sample cabinets.

More specifically, firstly luminance-chrominance means of each of the sample cabinets are counted in an manner of cabinet-by-cabinet, and then the luminance-chrominance mean deviation ratios are calculated as per the following expression:

$$\text{ratio}(i, j) = \frac{averCom(i, j)}{averCom(i, 0)}$$

Where the $ratio(i,j)$ indicates the luminance-chrominance mean deviation ratio of the j-th sample cabinet at the i-th component, the $averCom(i,j)$ indicates the luminance-chrominance mean of the j-th sample cabinet at the i-th component, the $averCom(i,0)$ indicates the luminance-chrominance mean of the 0-th sample cabinet at the i-th component (for example, the 0-th sample cabinet is the sample cabinet No. 1, of course it can be the other sample cabinet). Herein, it is noted that, taking the RGB full-color LED cabinet as an example, the luminance-chrominance values of a single LED pixel (typically including three primary color LEDs of red, green and blue) have nine components in total (because each color corresponds to one luminance component and two chrominance components), and so $0 \le i \le 8$. FIG. 1 shows the small screen with the sample cabinets has six cabinets, and so $0 \le j \le 5$. In other words, the ratios of luminance-chrominance means of each of the sample cabinets to luminance-chrominance means of the sample cabinet No. 1 are calculated individually as per each of the luminance and chrominance components.

(3) Building a large screen to be calibrated by use of the sample cabinets and remaining cabinets of the to-be-calibrated cabinets.

In particular, during building the large screen to be calibrated, it is ensured that the sample cabinets are placed at designated positions (referred to as fulcrum positions in this embodiment) and the remaining to-be-calibrated cabinets can be placed at any other positions of the large screen. A resolution for the large screen is relatively free, as long as it does not exceed an upper limit of resolution of a screen calibrated in a manner of dividing LED pixels in groups for image acquisition, for example, if each 4*4 pixels are used as one group (it is only for example, but not for limiting the disclosure), the upper limit of resolution of the screen is 900*600. The built large screen to be calibrated may refer to the illustration in FIG. 2, that is, besides the sample cabinets located at the fulcrum positions, there may be some or all of cabinets in the remaining of the to-be-calibrated cabinets. Generally speaking, the positions of the sample cabinets in the large screen to be calibrated are required to represent the entire surface as much as possible, that is, the luminance-chrominance distribution surfaces fitted by the sample cabinets can represent the luminance-chrominance distribution surfaces of the entire large screen as much as possible. As to the large screen to be calibrated shown in FIG. 2, four of the six sample cabinets illustrated in FIG. 1 are arbitrarily selected and placed at four corner positions of the large screen, the remaining two sample cabinets are placed in middle positions of the large screen, and the other positions in FIG. 2 are placed with the remaining cabinets to be calibrated. Of course, in other cases, for example three sample cabinets are selected, one of the selected sample cabinets may be placed at an upper middle position of the large screen to be calibrated, and the other two sample cabinets are respectively placed in the lower left corner and the lower right corner of the large screen. In short, the positions of the sample cabinets in the large screen to be calibrated are not very strict, and as long as the sample cabinets are dispersed as much as possible in the large screen.

(4) Erecting an image acquisition equipment such as an area array camera to acquire/collect full-screen red, green and blue original luminance-chrominance values of the large screen to be calibrated.

Specifically, first, selecting an appropriate calibration distance (also referred to as image acquisition distance) to acquire red, green and blue monochrome images in a manner of dividing pixels in groups. Each 4*4 pixels being used as one pixel group is taken as an example, the red, green and blue monochrome images needed to be acquired are sixteen pieces in total.

Second, extracting full-screen red, green and blue original luminance-chrominance values of the large screen.

In particular, the extracting of red, green and blue luminance-chrominance values from the red, green and blue monochrome images is an existing mature technology, and specific steps thereof may be as follows that: firstly performing points positioning on each of the monochrome images, secondly counting luminance component values and chrominance component values of LED pixels in each monochrome image in a manner of pixel-by-pixel, then normalizing luminance-chrominance values (including the luminance component values and the chrominance component values) of each monochrome image (keeping a ratio of RGB components unchanged), and finally combining the luminance-chrominance values of the monochrome images together.

(5) Performing weighted fitting surface amendments for full-screen red, green and blue original luminance-chrominance values of the large screen in a manner of component-by-component.

More specifically, first, the original luminance-chrominance values of each sample cabinet in the large screen are adjusted according to the luminance-chrominance mean deviation ratios among the sample cabinets calculated in the above step (2), as shown in the following formula:

$$adjustCom(i, k) = \frac{originCom(i, k)}{\text{ratio}(i, j)}$$

Where the $originCom(i,k)$ indicates the original value of the k-th LED pixel at the i-th component, the $adjustCom(i,k)$ indicates the adjusted value of the k-th LED pixel at the i-th component, the $ratio(i,j)$ indicates the luminance-chrominance mean deviation ratio of the j-th sample cabinet at the i-th component. Herein, the adjustment is only applied to the sample cabinets at the fulcrum positions of the large screen, the original luminance-chrominance values of the LED pixels of the to-be-calibrated cabinets at other positions are not adjusted, and after the adjustment, the luminance-chrominance means of respective sample cabinets will be approximately equal.

Second, generating weighted fitting surfaces according to full-screen adjusted luminance-chrominance values of the large screen.

In particular, a polynomial surface fitting based on least squares method belongs to the existing mature technology, this embodiment defines a third-order fitting equation about a relationship between the luminance-chrominance values and position coordinates of the full-screen LED pixels of the large screen (i.e., luminance-chrominance distribution), and the equation is as follows:

$$f(x,y)=c_1+c_2x+c_3y+c_4xy+c_5x^2+c_6y^2+c_7xy^2+c_8x^2y+c_9x^3+c_{10}y^3$$

First, constructing a fitting matrix B as shown below:

$$B = \begin{bmatrix} w & wx_1 & wy_1 & wx_1y_1 & wx_1^2 & wy_1^2 & wx_1y_1^2 & wx_1^2y_1 & wx_1^3 & wy_1^3 \\ \cdots & \cdots & \cdots & \cdots & \cdots & \cdots & \cdots & \cdots & \cdots & \cdots \\ w & wx_{k-1} & wy_{k-1} & wx_{k-1}y_{k-1} & wx_{k-1}^2 & wy_{k-1}^2 & wx_{k-1}y_{k-1}^2 & wx_{k-1}^2y_{k-1} & wx_{k-1}^3 & wy_{k-1}^3 \\ 1 & x_k & y_k & x_ky_k & x_k^2 & y_k^2 & x_ky_k^2 & x_k^2y_k & x_k^3 & y_k^3 \\ \cdots & \cdots & \cdots & \cdots & \cdots & \cdots & \cdots & \cdots & \cdots & \cdots \\ 1 & x_n & y_n & x_ny_n & x_n^2 & y_n^2 & x_ny_n^2 & x_n^2y_n & x_n^3 & y_n^3 \end{bmatrix}$$

Where the front (k−1) numbers of LED pixels indicate/represent the pixels inside the sample cabinets in the large screen and a weighted coefficient w (w>1) is needed to be added thereto, and in the exemplary embodiment the value of w is 10; and the rear (n−k+1) numbers of LED pixels indicate the pixels located outside the sample cabinets and in the large screen. Herein, it should be understood that the total number of LED pixels of all the cabinets to be calibrated (including the sample cabinets) in the entire large screen is assumed to be n, and the total number of LED pixels in all the sample cabinets is assumed to be (k−1).

Second, constructing a fitting matrix Z as shown below:

$$Z = \begin{bmatrix} w*adjustCom(1) \\ \cdots \\ w*adjustCom(k-1) \\ originCom(k) \\ \cdots \\ originCom(n) \end{bmatrix}$$

Where the front (k−1) numbers of LED pixels indicate the pixels located inside the sample cabinets in the large screen, and the weighted coefficient w (w>1) is needed to be added thereto, and in the exemplary embodiment the value of w is 10; and the rear (n−k+1) numbers of LED pixels indicate the pixels located outside the sample cabinets and in the large screen. The $adjustCom(*)$ of the fitting matrix Z indicates component values of the (k−1) numbers of LED pixels after being adjusted according to the luminance-chrominance mean deviation ratios among the sample cabinets, and wherein the * in the parentheses indicate 1~(k−1).

Afterwards, calculating a fitting coefficient matrix C as shown below:

$$C=[B^TB]^{-1}[B^TZ].$$

Finally, the fitting coefficient matrix C is substituted into the fitting polynomial f(x, y) to calculate the fitting surface data $surface$ and thereby obtain the weighted fitting surface. Herein, it should be understood that each component of the luminance-chrominance values corresponds to one weighted fitting surface.

Third, amending full-screen original luminance-chrominance values of the large screen to be calibrated according to the fitting surfaces.

In particular, calculating full-screen fitting surface amended luminance-chrominance values of the large screen as per the following equation:

$$\frac{amendCom(p,q)}{originCom(p,q)} = \frac{\text{surface}(p,q)}{AVER}$$

Where the $originCom(p,q)$ indicates the original value of the q-th LED pixel at the p-th component; the $amendCom(p,q)$ indicates the fitting surface amended value of the q-th LED pixel at the p-th component, the $surface(p,q)$ indicates the fitting surface data of the q-th LED pixel at the p-th component, and the $AVER$ indicates a mean (i.e., average value) of full-screen fitting surface data of the large screen to be calibrated at the p-th component;

(6) Setting calibration target values to calculate full-screen pixel-by-pixel calibration coefficients of the large screen to be calibrated.

More specifically, first, calculating original luminance-chrominance means of all sample cabinets at the fulcrum positions of the large screen, as per the following equation:

$$fulcrumAver(i) = \frac{sum(originCom(i,m))}{num}$$

Where the $fulcrumAver(i)$ indicates a mean at the i-th components of all the sample cabinets, the originCom(i,m) indicates the value of a LED pixel of the m-th sample cabinet at the i-th component, the $num$ indicates the number of LED pixels of all the sample cabinets at the fulcrum positions of the entire large screen, the sum(originCom(i,m)) indicates the sum of the i-th components of the original luminance-chrominance values of the num numbers of LED pixels in total on all the sample cabinets.

Second, using the original luminance-chrominance means of all the sample cabinets in the entire large screen after being sacrificed with a percentage as target values, for example, the luminance values are sacrificed with 20% as target values as follows:

$$rL=(1-20\%)*fulcrumAver(rL) \quad rC_x=0.6900$$
$$rC_y=0.3000$$

$$gL=(1-20\%)*fulcrumAver(gL) \quad gC_x=0.1700$$
$$gC_y=0.7400$$

$$bL=(1-20\%)*fulcrumAver(bL) \quad bC_x=0.1300$$
$$bC_y=0.0800$$

Where the rL, gL and bL indicate red, green and blue luminance target values; the $fulcrumAver(rL)$, $fulcrumAver(gL)$ and $fulcrumAver(bL)$ respectively indicate means of red, green and blue luminance components of all the sample cabinets; the rCx, rCy, gCx, gCy, bCx and bCy respectively indicate red, green and blue chrominance target values. Herein, the chrominance target values are default values, that is, the chrominance values are not sacrificed. In the exemplary embodiment, the target values are set according to the luminance means of the sample cabinets of the entire large screen after being sacrificed with a percentage, and thus it can ensure consistency of luminance-chrominance among sub-screens.

Third, calculating the calibration coefficients (e.g., pixel-by-pixel calibration coefficients) of all LED pixels on the entire large screen. A specific calculation of the full-screen pixel-by-pixel calibration coefficients is as follows:

$$\text{coefficient}=\text{target}*\text{origin}^{-1}$$

Where the origin indicates the luminance-chrominance initial values, i.e., the fitting surface amended luminance-chrominance values of the large screen; the target indicates the luminance-chrominance target values, the coefficient indicates the pixel-by-pixel luminance-chrominance calibration coefficients. Subsequently, the large screen's full-screen pixel-by-pixel luminance-chrominance calibration coefficients may be divided into a plurality of cabinet calibration coefficient files and then respectively stored in the corresponding to-be-calibrated cabinets, for example, stored in receiving cards equipped by corresponding to-be-calibrated cabinets.

In addition, it should be noted that when the number of the cabinets to be calibrated is large, it may not be possible to finish the calibration one time by building one large screen and thus the calibration is performed in a manner of building multiple sub-screens (also referred to as sub-screen calibration). The method of building to-be-calibrated large screens for sub-screen calibration is to keep the sample cabinets at the fulcrum positions unchanged and only replace the cabinets to be calibrated in other positions to thereby perform the above mentioned full-screen calibration, until all the remaining cabinets to be calibrated except the sample cabinets are calibrated. The pixel-by-pixel calibration method for realizing arbitrary splicing of the LED cabinets can refer to the illustration of FIG. 3.

In summary, the foregoing embodiments of the disclosure may achieve following advantages or benefits: (a) avoiding the problem of inconsistent surface transition caused by arbitrary splicing of cabinets after being calibrated; (b) avoiding the trouble of recording and finding cabinet numbers in rental sites; (c) avoiding the trouble of requiring full-screen calibration at each rental site; and (d) allowing the renter/lessor to save the costs of purchasing luminance-chrominance measuring instruments.

In the several embodiments provided by the disclosure, it should be understood that the illustrated system, device, and method may be implemented in other manners. For example, the embodiments of device described above are merely illustrative, for example, the division of units is only a logical function division, and in actual implementations there may be another division manner, for example, multiple units or components may be combined or integrated into another system, or some features can be ignored or not executed. In addition, the coupling or direct coupling or communication connection as illustrated may be an indirect coupling or communication connection through some interfaces, devices or units, and further may be in an electrical, mechanical or other form.

The units described as separate components may be or may not be physically separated, and the components illustrated as units may be or may not be physical units, that is, may be located in one place, or may be distributed to multiple network units. Some or all of the units may be selected according to actual needs to achieve the purposes of the solutions of the embodiments.

In addition, each functional unit in each embodiment of the disclosure may be integrated into one processing unit, or each unit may be physically separated, or two or more units may be integrated into one unit. The above integrated unit can be implemented in a form of hardware or in a form of hardware with a software functional unit(s).

The above integrated unit implemented in the form of the software functional unit(s) can be stored in a computer readable storage medium. The above software functional unit(s) is/are stored in a storage medium and include(s) several instructions for causing a computer device (which may be a personal computer, a server, or a network device, etc.) to perform some of the steps of various embodiments of the disclosure. The foregoing storage medium may be a U-disk, a mobile hard disk, a read-only memory (ROM), a random access memory (RAM), a magnetic disk, or an optical disk, which can store program codes.

Finally, it should be noted that the above embodiments are only for exemplary illustrating the technical solutions of the disclosure, but not intended for limiting the disclosure; although the disclosure has been described in detail with reference to the foregoing embodiments, for the person skilled in the art of the disclosure, it should be understood that the technical solutions described in the foregoing embodiments may be modified, or some of the technical features may be equivalently substituted; and these modifications or substitutions do not make the essences of corresponding technical solutions deviate from the spirit and scope of the technical solutions of the embodiments of the disclosure.

What is claimed is:

1. A pixel-by-pixel calibration method, comprising steps of:
   (i) obtaining luminance-chrominance values of a small screen with sample cabinets by image acquisition on the small screen, wherein the small screen is formed by splicing at least three LED cabinets which are selected from a plurality of LED cabinets to be calibrated as the sample cabinets;
   (ii) obtaining luminance-chrominance mean deviation ratios among the sample cabinets according to the luminance-chrominance values of the small screen;
   (iii) obtaining original luminance-chrominance values of a large screen to be calibrated by image acquisition on the large screen, wherein the large screen is formed by splicing the sample cabinets and some or all of LED cabinets of the plurality of LED cabinets to be calibrated except the sample cabinets;
   (iv) obtaining adjusted luminance-chrominance values of the large screen by adjusting original luminance-chrominance values of the sample cabinets in the original luminance-chrominance values of the large screen by use of the luminance-chrominance mean deviation ratios among the sample cabinets;
   (v) generating luminance-chrominance distribution fitting surfaces of the large screen according to the adjusted luminance-chrominance values of the large screen, and amending the original luminance-chrominance values of the large screen according to the luminance-chrominance distribution fitting surfaces to thereby obtain fitting surface amended luminance-chrominance values of the large screen; and
   (vi) setting luminance-chrominance target values based on means of the original luminance-chrominance values of the sample cabinets in the large screen and setting the fitting surface amended luminance-chrominance values of the large screen as luminance-chrominance initial values, and thereby obtaining full-screen pixel-by-pixel calibration coefficients of the large screen;

wherein the step (v) comprises:

performing polynomial surface fittings based on least squares method on the adjusted luminance-chrominance values of the large screen and giving weighted coefficients of greater than 1 to adjusted luminance-chrominance values of the sample cabinets in the adjusted luminance-chrominance values of the large screen, to thereby obtain the luminance-chrominance distribution fitting surfaces of the large screen.

2. The pixel-by-pixel calibration method according to claim 1, after the step (vi), further comprising:

dividing the full-screen pixel-by-pixel calibration coefficients of the large screen into a plurality of cabinet calibration coefficient files, and storing the plurality of cabinet calibration coefficient files respectively to receiving cards equipped by corresponding cabinets to be calibrated.

3. The pixel-by-pixel calibration method according to claim 1, wherein the large screen is formed by splicing the sample cabinets and some rather than all of the LED cabinets of the plurality of LED cabinets to be calibrated except the sample cabinets, the pixel-by-pixel calibration method further comprises:

keeping the sample cabinets unchanged and replacing the LED cabinets in other positions of the large screen different from positions of the sample cabinets by some or all of remaining of the plurality of LED cabinets to be calibrated, to thereby obtain a new large screen to be calibrated;

obtaining original luminance-chrominance values of the new large screen by image acquisition on the new large screen; and obtaining full-screen pixel-by-pixel calibration coefficients of the new large screen by performing the step (iv), the step (v) and the step (vi) again.

4. The pixel-by-pixel calibration method according to claim 1, wherein the step (vi) comprises:

using each luminance mean in the means of the original luminance-chrominance values of the sample cabinets in the large screen after being sacrificed with a certain percentage as a luminance target value in the luminance-chrominance target values, and setting each chrominance target value in the luminance-chrominance target values to be a default value.

5. The pixel-by-pixel calibration method according to claim 1, wherein the plurality of LED cabinets are RGB full-color LED cabinets.

6. A pixel-by-pixel calibration method, comprising steps of:

splicing at least three LED cabinets which are selected from a plurality of LED cabinets to be calibrated as sample cabinets, in a row and column arrangement to form a small screen;

obtaining luminance-chrominance values of the small screen with the sample cabinets;

obtaining luminance-chrominance mean deviation ratios among the sample cabinets according to the luminance-chrominance values of the small screen;

splicing the sample cabinets and some or all of LED cabinets of the plurality of LED cabinets to be calibrated except the sample cabinets, in a row and column arrangement to form a large screen to be calibrated, wherein the large screen to be calibrated and the small screen are different screens, and a positional distribution of the sample cabinets in the small screen is different from that of the sample cabinets in the large screen to be calibrated;

obtaining original luminance-chrominance values of the large screen to be calibrated by image acquisition on the large screen;

obtaining adjusted luminance-chrominance values of the large screen by adjusting original luminance-chrominance values of the sample cabinets in the original luminance-chrominance values of the large screen by use of the luminance-chrominance mean deviation ratios among the sample cabinets;

generating luminance-chrominance distribution fitting surfaces of the large screen according to the adjusted luminance-chrominance values of the large screen, and amending the original luminance-chrominance values of the large screen according to the luminance-chrominance distribution fitting surfaces to thereby obtain fitting surface amended luminance-chrominance values of the large screen; and setting luminance-chrominance target values based on means of the original luminance-chrominance values of the sample cabinets in the large screen and setting the fitting surface amended luminance-chrominance values of the large screen as luminance-chrominance initial values, and thereby obtaining full-screen pixel-by-pixel calibration coefficients of the large screen.

7. The pixel-by-pixel calibration method according to claim 6, after obtaining full-screen pixel-by-pixel calibration coefficients of the large screen, further comprising:

dividing the full-screen pixel-by-pixel calibration coefficients of the large screen into a plurality of cabinet calibration coefficient files, and storing the plurality of cabinet calibration coefficient files respectively to receiving cards equipped by corresponding cabinets to be calibrated.

8. The pixel-by-pixel calibration method according to claim 6, wherein the large screen is formed by splicing the sample cabinets and some rather than all of the LED cabinets of the plurality of LED cabinets to be calibrated except the sample cabinets, the pixel-by-pixel calibration method further comprises:

keeping the sample cabinets unchanged and replacing the LED cabinets in other positions of the large screen different from positions of the sample cabinets by some or all of remaining of the plurality of LED cabinets to be calibrated, to thereby obtain a new large screen to be calibrated;

obtaining original luminance-chrominance values of the new large screen by image acquisition on the new large screen; and obtaining full-screen pixel-by-pixel calibration coefficients of the new large screen by performing the following steps:

obtaining adjusted luminance-chrominance values of the new large screen by adjusting original luminance-chrominance values of the sample cabinets in the original luminance-chrominance values of the new large screen by use of the luminance-chrominance mean deviation ratios among the sample cabinets;

generating luminance-chrominance distribution fitting surfaces of the new large screen according to the adjusted luminance-chrominance values of the new large screen, and amending the original luminance-chrominance values of the new large screen according to the luminance-chrominance distribution fitting surfaces to thereby obtain fitting surface amended luminance-chrominance values of the new large screen; and setting luminance-chrominance target values based on means of the original luminance-chrominance values of the sample cabinets in the new large screen and setting the fitting surface amended luminance-chrominance values of the new large screen as luminance-chrominance initial values, and thereby obtaining full-screen pixel-by-pixel calibration coefficients of the new large screen.

9. The pixel-by-pixel calibration method according to claim 6, wherein generating luminance-chrominance distribution fitting surfaces of the large screen according to the adjusted luminance-chrominance values of the large screen comprises:

performing polynomial surface fittings based on least squares method on the adjusted luminance-chrominance values of the large screen and giving weighted coefficients of greater than 1 to adjusted luminance-chrominance values of the sample cabinets in the adjusted luminance-chrominance values of the large screen, to thereby obtain the luminance-chrominance distribution fitting surfaces of the large screen.

10. The pixel-by-pixel calibration method according to claim 6, wherein setting luminance-chrominance target values based on means of the original luminance-chrominance values of the sample cabinets in the large screen and setting the fitting surface amended luminance-chrominance values of the large screen as luminance-chrominance initial values, and thereby obtaining full-screen pixel-by-pixel calibration coefficients of the large screen, comprises:

using each luminance mean in the means of the original luminance-chrominance values of the sample cabinets in the large screen after being sacrificed with a certain percentage as a luminance target value in the luminance-chrominance target values, and setting each chrominance target value in the luminance-chrominance target values to be a default value.

11. The pixel-by-pixel calibration method according to claim 6, wherein the plurality of LED cabinets are RGB full-color LED cabinets.

* * * * *